(12) United States Patent
Tel et al.

(10) Patent No.: US 10,394,136 B2
(45) Date of Patent: Aug. 27, 2019

(54) METROLOGY METHOD FOR PROCESS WINDOW DEFINITION

(71) Applicant: ASML NETHERLANDS B.V., Veldhoven (NL)

(72) Inventors: Wim Tjibbo Tel, Helmond (NL); Marinus Jochemsen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/763,376

(22) PCT Filed: Sep. 14, 2016

(86) PCT No.: PCT/EP2016/071683
§ 371 (c)(1),
(2) Date: Mar. 26, 2018

(87) PCT Pub. No.: WO2017/055086
PCT Pub. Date: Apr. 6, 2017

(65) Prior Publication Data
US 2018/0284623 A1 Oct. 4, 2018

Related U.S. Application Data

(60) Provisional application No. 62/235,333, filed on Sep. 30, 2015.

(51) Int. Cl.
*G03F 7/20* (2006.01)
(52) U.S. Cl.
CPC ...... *G03F 7/70641* (2013.01); *G03F 7/70508* (2013.01); *G03F 7/70683* (2013.01)

(58) Field of Classification Search
CPC ............ G03F 7/70516; G03F 7/70508; G03F 7/70641
(Continued)

(56) References Cited

U.S. PATENT DOCUMENTS 7,619,717 B2 11/2009 Magnusson
7,791,732 B2 9/2010 Den Boef et al.
(Continued)

FOREIGN PATENT DOCUMENTS

EP 1997045 6/2016
WO 2015/080858 6/2015

OTHER PUBLICATIONS

International Search Report and Written Opinion dated Dec. 22, 2016 in corresponding International Patent Application No. PCT/EP2016/071683.

*Primary Examiner* — Hung Nguyen
(74) *Attorney, Agent, or Firm* — Pillsbury Winthrop Shaw Pittman LLP

(57) ABSTRACT

A method involving measuring a first metrology target designed for a first range of values of a process parameter; measuring a second metrology target designed for a second range of values of the same process parameter, the second range different than the first range and the second metrology target having a different physical design than the first metrology target; and deriving process window data from a value of the process parameter in the first range determined from the measuring of the first metrology target, and from a value of the process parameter in the second range determined from the measuring of the second metrology target.

23 Claims, 8 Drawing Sheets

(58) Field of Classification Search
USPC .............................................. 355/52, 53, 55
See application file for complete search history.

(56) References Cited

U.S. PATENT DOCUMENTS

| | | |
|---|---|---|
| 8,411,287 B2 | 4/2013 | Smilde et al. |
| 8,891,061 B2 | 11/2014 | Leewis et al. |
| 8,908,148 B2 | 12/2014 | Geraets et al. |
| 9,081,303 B2 | 7/2015 | Cramer et al. |
| 2002/0097399 A1 | 7/2002 | Ausschnitt et al. |
| 2005/0185174 A1 | 8/2005 | Laan et al. |
| 2006/0066855 A1 | 3/2006 | Den Boef et al. |
| 2007/0031745 A1 | 2/2007 | Ye et al. |
| 2008/0088812 A1 | 4/2008 | Magnusson |
| 2011/0027704 A1 | 2/2011 | Cramer et al. |
| 2011/0043791 A1 | 2/2011 | Smilde et al. |
| 2011/0249244 A1 | 10/2011 | Leewis et al. |
| 2012/0013875 A1 | 1/2012 | Geraets et al. |
| 2012/0044470 A1 | 2/2012 | Smilde et al. |
| 2012/0303151 A1* | 11/2012 | Ye .......................... G05B 13/04 700/119 |
| 2014/0168620 A1* | 6/2014 | Schmitt-Weaver .......................... G03F 7/70516 355/52 |
| 2015/0046118 A1* | 2/2015 | Pandev ................... H01L 22/12 702/155 |
| 2015/0176985 A1 | 6/2015 | Shchegrov et al. |
| 2015/0248068 A1* | 9/2015 | Wang ................. G03F 7/70641 355/56 |

* cited by examiner

METROLOGY METHOD FOR PROCESS WINDOW DEFINITION

CROSS-REFERENCE TO RELATED APPLICATIONS

This application is the U.S. national phase entry of PCT patent application no. PCT/EP2016/071683, which was filed on Sep. 14, 2016, which claims the benefit of priority of U.S. provisional application No. 62/235,333, which was filed on Sep. 30, 2015, and each of which is incorporated herein in its entirety by reference.

FIELD

The present description relates to a method of defining a process window by metrology.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor one or more steps of the patterning process (i.e., a process of device manufacturing by making patterns, including, e.g., a patterning printing (e.g., optical lithography, imprint, etc.), resist-processing, etching, development, baking, etc.), the patterned substrate is inspected and one or more parameters of the patterned substrate are measured. The one or more parameters may include, for example, the overlay error between successive layers formed in or on the patterned substrate and/or critical linewidth of developed photosensitive resist. This measurement may be performed on a metrology target that comprises a product substrate feature and/or on a dedicated metrology target provided on the substrate. There are various techniques for making measurements of the microscopic structures formed in a patterning process, including the use of a scanning electron microscope and/or various specialized tools.

A fast and non-invasive form of specialized inspection tool is a scatterometer in which a beam of radiation is directed onto a target on a substrate and properties of the scattered or reflected beam are measured. By comparing one or more properties of the beam before and after it has been reflected or scattered from the substrate, one or more properties of the substrate can be determined. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity of the scattered radiation as a function of angle.

A particular application of scatterometry is in the measurement of feature asymmetry within a periodic target. This can be used as a measure of overlay error, for example, but other applications are also known. In an angle resolved scatterometer, asymmetry can be measured by comparing opposite parts of the diffraction spectrum (for example, comparing the −1st and +$1^{st}$ orders in the diffraction spectrum of a periodic grating). This can be done simply in angle-resolved scatterometry, as is described for example in U.S. patent application publication US2006-066855. Image based scatterometry measurements have been devised that involve taking separate images of the target using −$1^{st}$ and +$1^{st}$ order radiation in turn. Examples of this image based technique are described in published U.S. patent application publication nos. US2011-0027704, US2011-0043791 and US2012-0044470, which are incorporated herein in their entirety by reference.

SUMMARY

With reduction of the physical dimensions in patterning processes, there is demand to, for example, increase measurement accuracy/precision of the data determined from measurement of targets designed for metrology.

In an embodiment, there is provided a method comprising: measuring a first metrology target designed for a first range of values of a process parameter; measuring a second metrology target designed for a second range of values of the same process parameter, the second range different than the first range and the second metrology target having a different physical design than the first metrology target; and deriving process window data from a value of the process parameter in the first range determined from the measuring of the first metrology target, and from a value of the process parameter in the second range determined from the measuring of the second metrology target.

In an embodiment, there is provided a method comprising: measuring a first metrology target designed to have a best measurement property for measurements at a first value of a process parameter; measuring a second metrology target designed to have its same best measurement property for measurements at a second different value of the process parameter; and deriving process window data from measurement of the process parameter using the first and second metrology targets.

In an embodiment, there is provided a method comprising obtaining process window data derived from values of a process parameter in a first range determined from measuring of a first metrology target, and from values of the same process parameter in a second range, different from the first range, determined from measuring of a second metrology target, wherein the second metrology target has a different physical design than the first metrology target; and forming and/or controlling at least part of a patterning process based on the process window data.

In an embodiment, there is provided a method of manufacturing devices wherein a device pattern is applied to a series of substrates using a patterning process, the method including obtaining process window data using a method as described herein, and controlling at least part of the patterning process for later substrates in accordance with the result of the method.

In an embodiment, there is provided a non-transitory computer program product comprising machine-readable instructions for causing a processor to cause performance of a method as described herein.

In an embodiment, there is provided a system comprising: an inspection apparatus configured to provide a beam on a metrology target on a substrate and to detect radiation redirected by the metrology target to determine a parameter of a patterning process; and a non-transitory computer program product as described herein. In an embodiment, the system further comprises a lithographic apparatus, the lithographic apparatus comprising a support structure configured to hold a patterning device to modulate a radiation beam and a projection optical system arranged to project the modulated onto a radiation-sensitive substrate.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
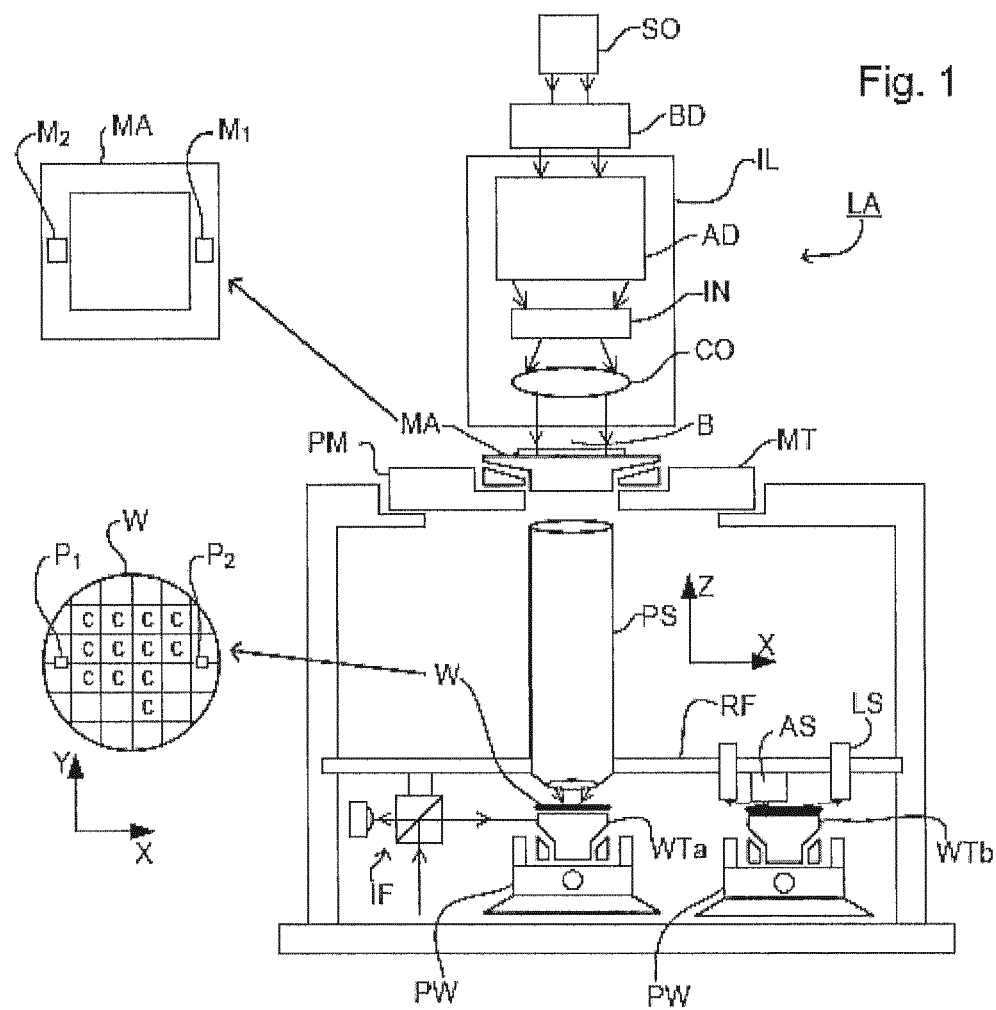
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. UV radiation, DUV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2.

Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
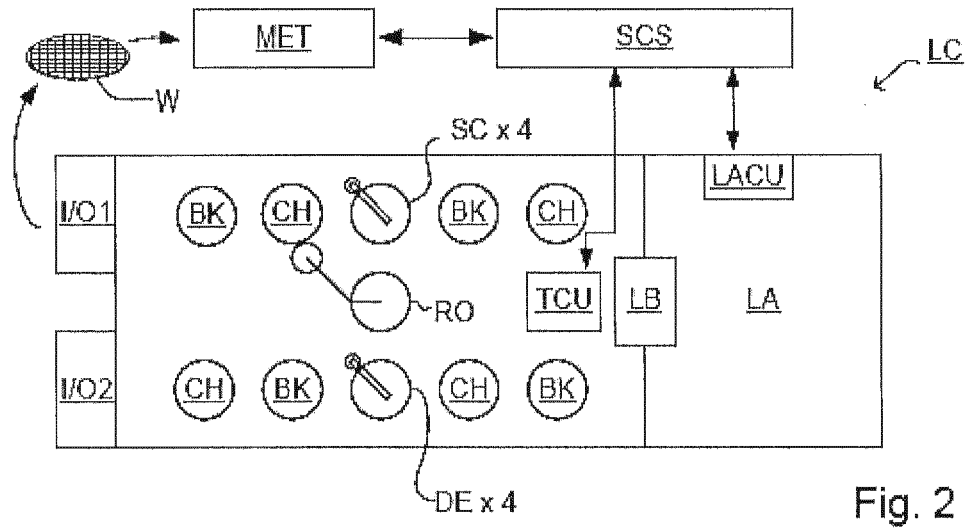
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure one or more properties such as overlay error between subsequent layers, line thickness, critical dimension (CD), etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithocell LC or may be a stand-alone device. To enable rapid measurement, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

Figure 3:
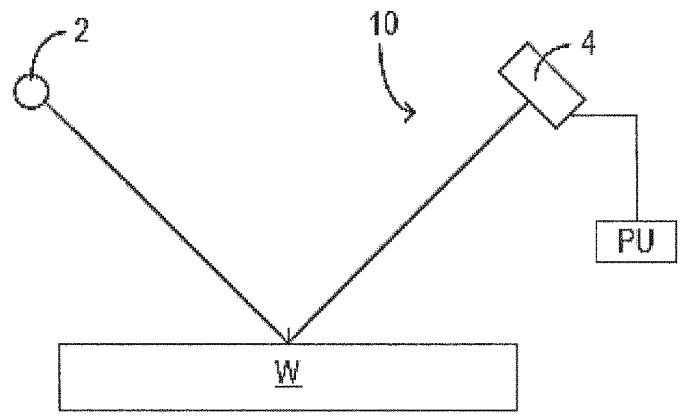
FIG. 3 schematically depicts an example inspection apparatus and metrology technique.
Figure 3:
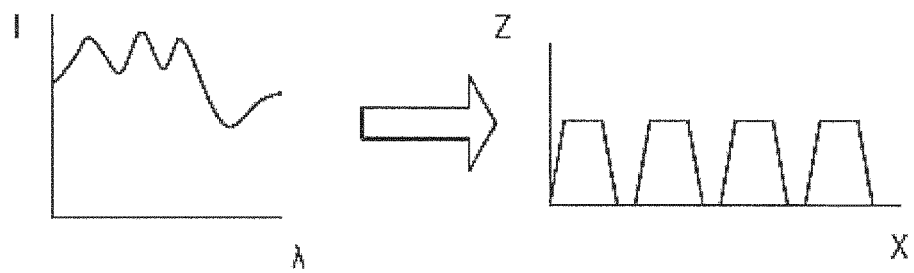

FIG. 3 depicts an example inspection apparatus (e.g., a scatterometer). It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some parameters are assumed from knowledge of the process by which the structure was made, leaving only a few parameters of the structure to be determined from the measured data. Such an inspection apparatus may be configured as a normal-incidence inspection apparatus or an oblique-incidence inspection apparatus.

Figure 4:
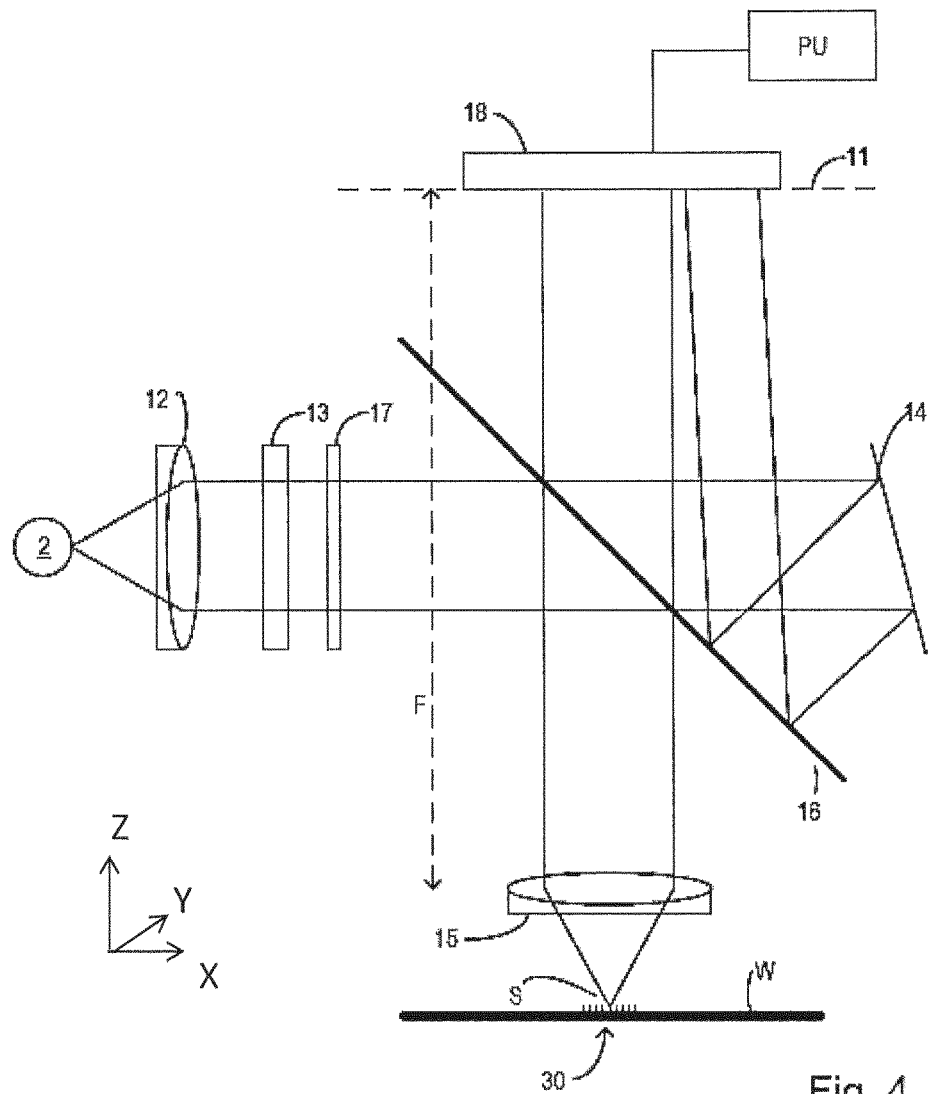
FIG. 4 schematically depicts an example inspection apparatus.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate tables WTa, WTb of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 is available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to optical aberration in the lithographic projection apparatus, particularly the projection system PS, and illumination symmetry and the presence of such aberration will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
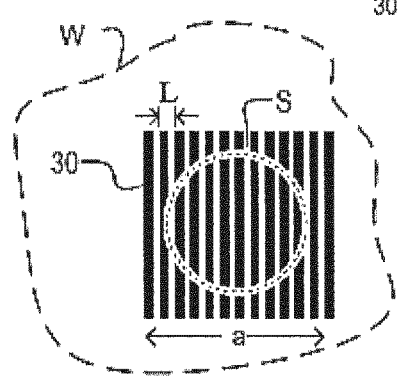
FIG. 5 illustrates the relationship between an illumination spot of an inspection apparatus and a metrology target.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
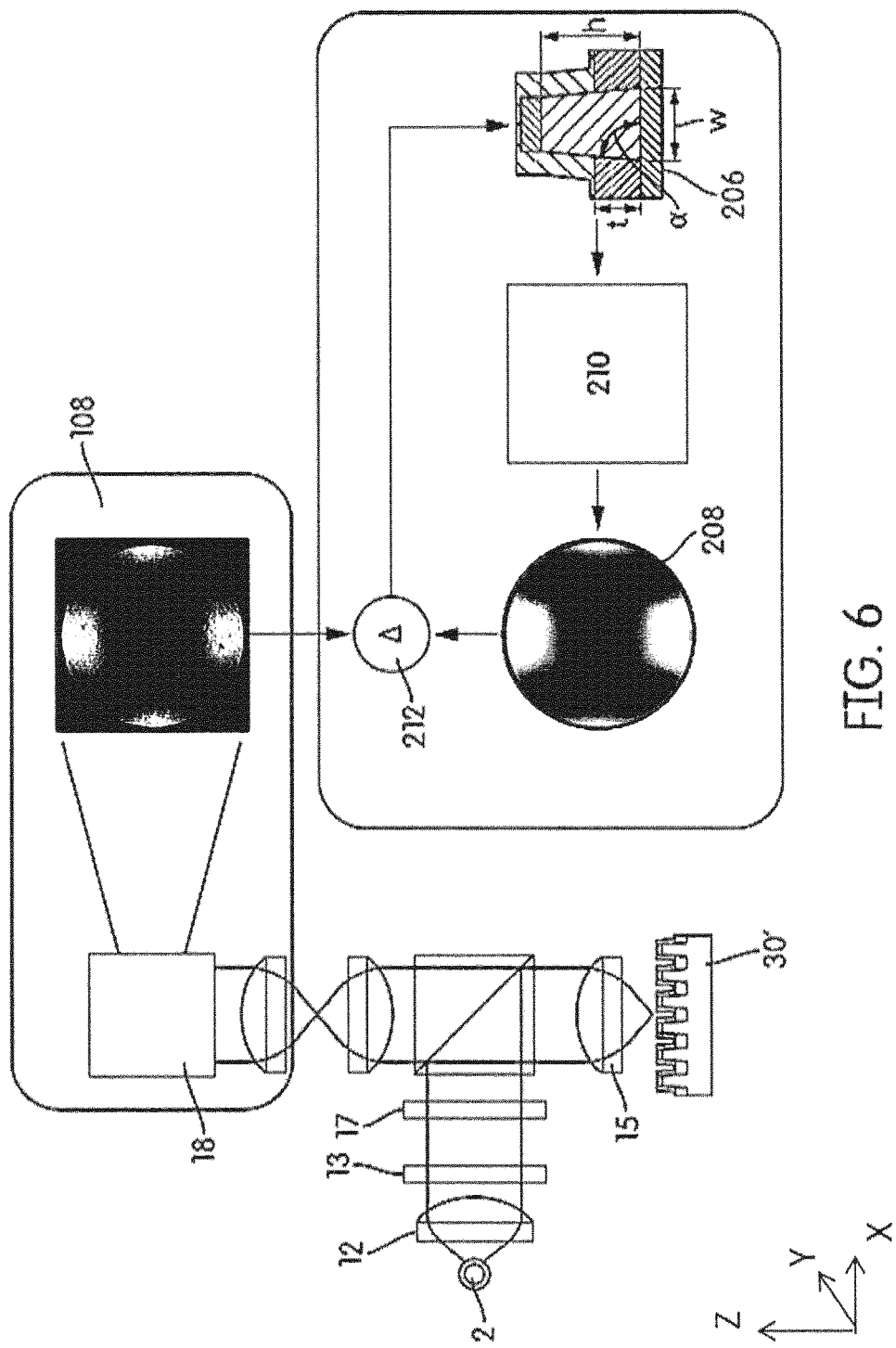
FIG. 6 schematically depicts a process of deriving a parameter of interest based on measurement data.

FIG. 6 schematically depicts an example process of the determination of one or more parameters of interest of a target pattern based on measurement data obtained using metrology. Radiation detected by detector 18 provides a measured radiation distribution 108 for target 30'. This measured radiation distribution 108 contains information to enable derivation of a parameter of interest such as the overlay error between successive layers formed in or on the substrate and/or critical dimension of, e.g., developed photosensitive resist.

For a given target 30', a radiation distribution 208 can be computed/simulated from a parameterized model 206 (which is an example unit cell model of a portion of a target (such as target 30, 30') and shows example layers of various materials making up, and associated with, the target, and further shows sample parameters that may be varied and derived, such as CD represented by w) of the pattern for target 30' using, for example, a numerical Maxwell solver 210. As noted above, the parameterized model 206 may include one or more of the parameters of the features and layers of the portion of the target under consideration, such as the thickness of one or more layers, the width (e.g., CD) of one or more features, the refractive index (e.g., a real or complex refractive index, refractive index tensor, etc.) of one or more of the layers, a sidewall angle of one or more layers, absorption of one or more layers, etc., as well as of any portions thereof. The initial values of the parameters may be those expected for the target being measured. The measured radiation distribution 108 is then compared at 212 to the computed radiation distribution 208 to determine the difference between the two. If there is a difference, the values of one or more of the parameters of the parameterized model 206 may be varied, a new computed radiation distribution 208 calculated and compared against the measured radiation distribution 108 until there is sufficient match between the measured radiation distribution 108 and the computed radiation distribution 208. At that point, the values of the parameters of the parameterized model 206 provide a good or best match of the geometry of the actual target 30'. One of those parameters of the parameterized model (e.g., CD) may be used by the user for evaluating one or more steps of the patterning process or other manufacturing process. Additionally or alternatively, a parameter of interest may be derived from one or more of the values of the parameterized model.

A patterning process may have one or more processing parameters. The patterning process may include processes upstream and/or downstream to the actual exposure. There may be various categories of process parameters. A first category may be parameters of a lithography apparatus or any other apparatuses used in the patterning process. Examples of this category include parameters of the source, projection optics, substrate stage, etc. of a lithography apparatus, parameters of an etch apparatus, parameters of a resist-development or baking tool, etc. For an optical lithography apparatus, such parameters can include focus, dose, angular or spatial illumination distribution, etc. A second category may be parameters of any procedures performed in the lithography process. Examples of this category include exposure duration, development temperature, chemical compositions used in development, etc. A third category may be parameters of the design layout. Examples of this category may include shapes and locations of assist features, and adjustments applied by a resolution enhancement technique (RET). A fourth category may be parameters of the substrate. Examples include characteristics of structures under a resist layer, chemical composition and/or physical dimensions of the resist layer. A fifth category may be characteristics of temporal variation of one or more parameters of the patterning process. For example, the process parameter may include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying parameters (e.g., stage position and/or laser intensity). A sixth category may be characteristics downstream to exposure, such as etching, deposition, doping and/or packaging parameters. Values of some or all of the processing parameters may be determined by a suitable method. For example, values may be determined from data obtained with various metrology tools (e.g., a substrate metrology tools). Values may be obtained from various sensors in the process tools (e.g., in the lithography apparatus). Values may be from an operator of the patterning process.

Further, in an embodiment, a patterning process model may be used to evaluate and/or change the patterning process. A patterning process model is a mathematical model that describes one or more steps of a manufacturing process that involves a pattern printing step. For example, the patterning process model may be a model that models exposure of a substrate using a patterning device, wherein the model describes the imaging and/or resist characteristics of the transfer of a pattern from the patterning device to the substrate. In an embodiment, the model may further model one or more pre-exposure and/or post-exposure processes, such as resist application, post-exposure bake, development, etch, etc.

Further, in an embodiment, a process window and process window data may be used to evaluate and/or change the patterning process alone or in conjunction with a patterning process model. From a mathematical point of view, a process window is a region in a vector space spanned by all the process parameters. In a given patterning process, the process window of a pattern is dictated only by the specifications of the pattern and the physics and/or chemistry involved in the patterning process. Namely, if the specifications and the physics/chemistry do not change during the patterning process, the process window does not change.

To aid in evaluation and/or change of the patterning process, it can be useful to consider a process window in terms of a plurality of the process parameters. For example, a process window (and associated process window data) can be defined as a set of focus and dose values for which a resist image is within a certain limit of the design target of the resist image. But, the process window and process window data may be extended to a generalized process window definition that can be established by different or additional base parameters in addition to, or alternatively to, exposure dose and defocus. These may include, but are not limited to, optical settings such as NA, sigma of the illumination, optical aberration, polarization, and/or optical constants of the resist layer. Further, various patterns for exposure using a patterning device may have different process windows (i.e., a space of the processing parameters under which a pattern will be produced within specification). Examples of pattern specifications that relate to potential systematic defects include checks for necking, line pull back, line thinning, critical dimension (CD), edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. In an embodiment, when controlling or changing a patterning process, it is possible and economical to focus on the hot spots; when the hot spots are not defective, it is most likely that the all the patterns are not defective. However, in an embodiment, other patterns may be considered to determine process window data.

For various uses, it is desirable to have one or more accurate patterning process models and/or accurate patterning process window data. The model(s) and/or process window data may be used in setup or control of the patterning process to, e.g., obtain better production of patterns and devices. For example, the model(s) and/or process window data may be used to vary one or more parameters of the lithographic apparatus (such as a dose setting, a focus-related setting, an angular/spatial intensity distribution of radiation impinging on the patterning device, etc.) prior to or during production exposure of a substrates. The one or more parameters may be varied prior to exposure of a first substrate of a lot of substrate, varied between exposures on a substrate, varied between exposures of different substrates of a lot, etc. using the model(s) and/or process window data. For example, the model(s) and/or process window data may be used to evaluate and/or set one or more parameters for a production run of a patterning process. As another example, one or more measured values obtained during a production run of a patterning process may be used in conjunction with the model(s) and/or process window data to vary one or more parameters of the patterning process for subsequent exposed dies, subsequent substrates, subsequent lots, etc.

Figure 7:
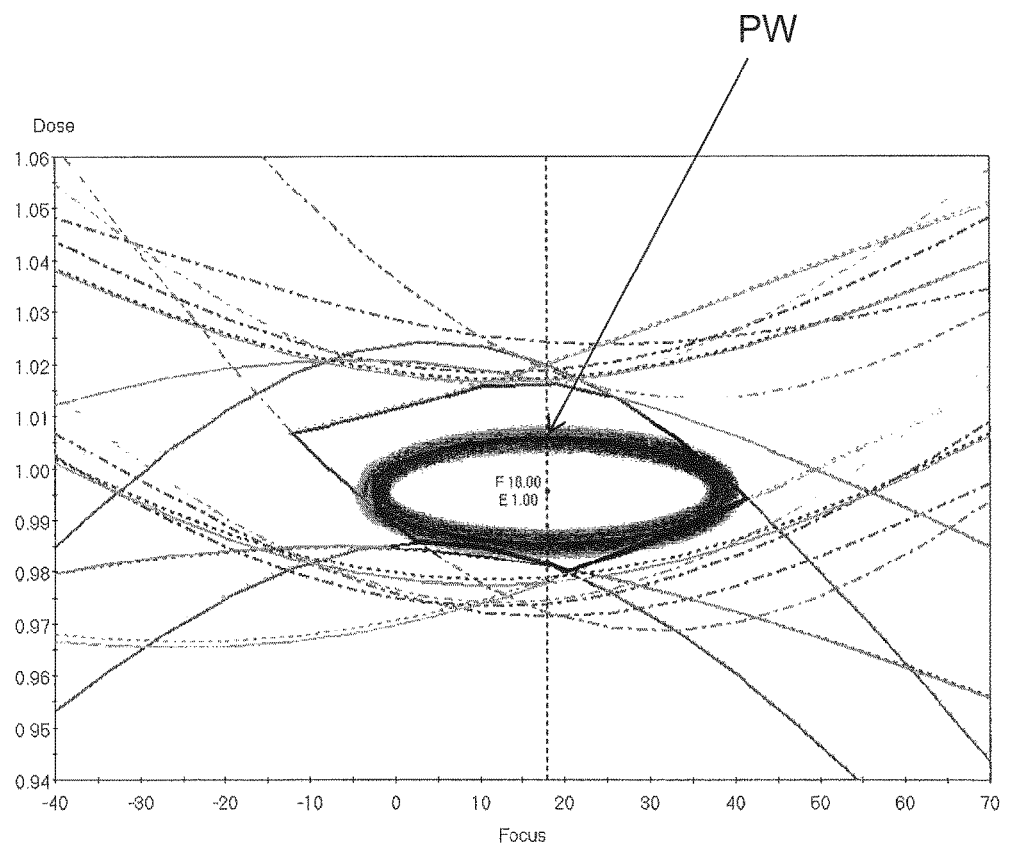
FIG. 7 schematically depicts example focus/dose Bossung curves and an example associated process window PW.

To obtain an accurate model and/or accurate process window data, a number of targets formed at varying conditions of a patterning process can be measured to obtain data reflective of a range of possible variations in the patterning process. For example, a relatively large number of targets (e.g., CD gauges, 1D features, 2D features, hotspots (e.g., a combination of features known to be difficult to expose), etc.) can be exposed for a range of different values of one or more process parameters (e.g., for a process window comprising a combination of focus and dose parameters, a range of different values of focus and dose) and then one or more parameters (e.g., CD) are determined or measured from the formed targets. In an embodiment, such different values of one or more process parameters (e.g., focus and dose) that correspond to a certain determined or measured value of another parameter (or within a certain tolerance of that certain value (e.g., within less than or equal to 15%, within less than or equal to 10%, within less than or equal to 5%, etc. of the certain value)) can be collected to define process window data (which can be used to define or parameterize a patterning process model). For example, for a process window comprising dose and focus, the process window data may be the ranges of focus and dose that produce certain determined or measured critical dimensions (e.g., a design CD within a specific tolerance, such as +/−10%) for various types of targets (e.g., CD gauges, 1D features, 2D features, hotspots (e.g., a combination of features known to be difficult to expose), etc.). Such data can then be used to produce, for example, one or more Bossung curves, such as focus/dose Bossung curves as depicted in FIG. 7 (where the best focus is at 0 and the dose is normalized to 1). A process window PW may then be defined which identifies a range of the process window parameters within which the process produces one or more various patterned features within design specifications. For example, the process window PW may specify a range of the process windows parameters (e.g., focus and dose) within which one or more various pattern features are imaged with CD within a certain tolerance of design CD.

Further, to obtain a more accurate model and/or more accurate process window data, the actual values of the one or more process parameters (e.g. focus, dose, etc.) can be determined at or near the measured formed targets. That is, in addition, or alternatively, to using separately obtained values of the one or more process parameters (e.g., values of focus derived from lithographic apparatus levelling/servo data at the time of exposure, nominal or measured values of dose from the lithographic apparatus, etc.), measurements at or near the formed targets can be made to determine accurately values of one or more parameters (e.g., focus, dose, etc.) prevailing at or near the formation of the measured formed target. To accomplish this, for example, a metrology target may be provided for measurement of the one or more parameters. For example, a metrology target may be created at the time of the formation of the formed targets, which metrology target has a design that is sensitive to the one or more process parameters and from which a value of the one or more process parameters prevailing at the formation of the formed targets can be determined. For example, the critical dimension of the metrology target can be sensitive to focus and so a measurement of the metrology target can be used to determine the critical dimension and the difference of the measured critical dimension from the nominal critical dimension of the metrology target can be used to derive the focus. In an embodiment, the metrology targets are diffraction-based targets. In an embodiment, the metrology targets are sensitive to focus. In an embodiment, the metrology targets are sensitive to dose. In an embodiment, the metrology targets are measured using one of the techniques described herein.

A potential issue with determining the one or more process parameters from measuring a metrology target is that the metrology target (for example, for a diffraction-based metrology target measurement technique) may have a limited accurate capture range. For example, for determination of focus, at larger defocus, the measurements may not be possible or not as accurate for no, or small, defocus. So, at the edges of the process window (e.g., at large defocus), the determination of values for one or more process parameters may fail completely or be much less accurate compared to determination of the values for the one or more process measurements at locations well within the process window (e.g., at best focus). So, while a metrology target may be designed with high capture range (e.g., enable measurement of a wide range of focus values) so that one type of metrology target may be used for the whole process window, the larger the capture range, the lower the sensitivity. Thus, measurements over the range of the process parameter may suffer a loss of precision.

Moreover, in some instances, the quality of values of the one or more parameters of process window data at one or more edges of the process window may be more significant than the quality of values of the one or more parameters of process window data at the interior of the process window. That is because the one or more edges of the process window define the outer bound of the range of process windows parameter values within which the process produces one or more patterned features within design specifications (e.g., one or more pattern features imaged with CD within a certain tolerance of design CD). So, for example, some applications (e.g., ASML's Process Window Optimizer or ASML's Lithography Manufacturability Check (LMC) products) may be mainly interested in the edge of the process window in order to accurately determine, e.g., applicable process parameter thresholds at which a defect is likely to occur. Accordingly, since such applications want to detect and/or prevent defects, information about the edge of the process window is significant for such applications.

Accordingly, it desirable to obtain more accurate and reliable data regarding one or more process parameters to determine process window data, which data regarding one or more process parameters may additionally or alternatively be used to improve the accuracy of one or more patterning process models.

Figure 8:
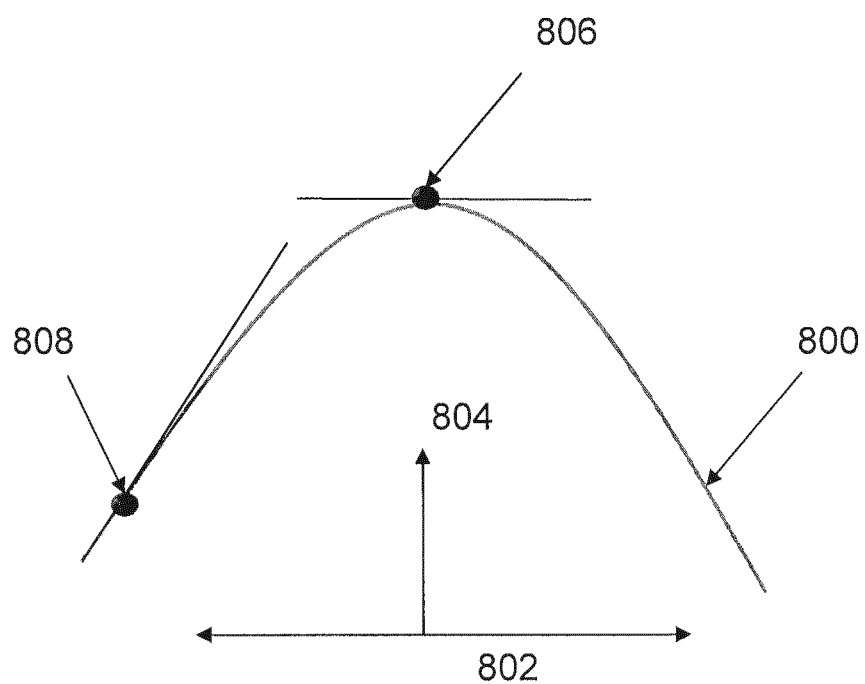
FIG. 8 schematically depicts a portion of an example Bossung curve for two process parameters.

In FIG. 8, an example portion of a Bossung curve 800 for two process parameters 802 and 804 is schematically depicted. In an embodiment, the first process parameter 802 may be focus and the second process parameter 804 may be dose. Thus, the Bossung curve is the focus/dose data that produces a pattern feature at nominal CD or within a certain tolerance of that nominal CD. While the examples in this document may be described in terms of focus and dose as being the process parameters and CD as being the target parameter of the Bossung curve, it will be appreciated that different and/or more process parameters may be used and the different process parameters may be combinations involving focus and/or dose. Further, a different target parameter than CD may be used.

Referring to FIG. 8, the apex 806 of the Bossung curve in this example is generally close to best focus or at relatively slight defocus (for a pattern feature at nominal CD or within a certain tolerance of that nominal CD). The side of the curve on the left side of the apex extends toward greater negative defocus and the side of the curve on the right side of the apex extends toward greater positive defocus.

As indicated in FIG. 8 at the tangent at the apex 806, there is relatively low sensitivity of critical dimension (CD) to focus (F), i.e., low dCD/dF. Accordingly, at the middle of the process window in terms of focus, determining focus via measuring CD has little to no sensitivity at best focus or low defocus. In contrast, as shown at the tangent in FIG. 8 at example point 808, there is relatively high sensitivity of critical dimension (CD) to focus (F), i.e., high dCD/dF, at relatively high defocus (whether positive or negative). Accordingly, at the edge of the process window in terms of focus, determining focus via measuring CD has high sensitivity at relatively large defocus.

So, in an embodiment, there is provided at least two different metrology targets to be measured for determining process window data. That is, there is provided at least two metrology targets having a respective different physical design, wherein a first metrology target is designed for measuring a first range of values of a process parameter and a second metrology target is designed for measuring a second range of values of the same process parameter, the second range different than the first range. Process window data is derived from a value of the process parameter in the first range determined from the measuring of the first metrology target, and from a value of the process parameter in the second range determined from the measuring of the second metrology target.

In an embodiment, the first and second metrology targets comprise a respective periodic structure having respective one or more different physical features, such as different pitch, different periodic feature width, different periodic space width, etc. In an embodiment, the periodic structures of the first and second metrology targets may be different in more than one physical feature. So, for example, the periodic structure of the first metrology target may have a different pitch and/or different periodic feature width than that of the second metrology target. In an embodiment, the first and second metrology targets respectively comprise a diffraction periodic structure.

In an embodiment, the metrology targets may be designed to measure a particular process window parameter (e.g., focus). In an embodiment, for example, the critical dimension of one or more features of the metrology targets when created on a substrate is sensitive to focus is creating the metrology targets such that determining a critical dimension of the one or more features of the metrology targets on the substrate yields a measure of focus at the time of exposure. For example, the critical dimension may be measured from radiation diffracted by the metrology target. In other embodiment, the critical dimension may be measured using a scanning electron microscope or other metrology apparatus.

As discussed above, in terms of focus as the process parameter, determining focus via measuring CD has little to no sensitivity at best focus or low defocus and determining focus via measuring CD has high sensitivity at relatively large defocus. Thus, in an embodiment, a first metrology target may be designed for measuring at a middle of the process window in terms of at least one of the process window parameters and a second metrology target may be designed for measuring at one or more edges of the process window in terms of at least of the process window parameters.

Figure 9:
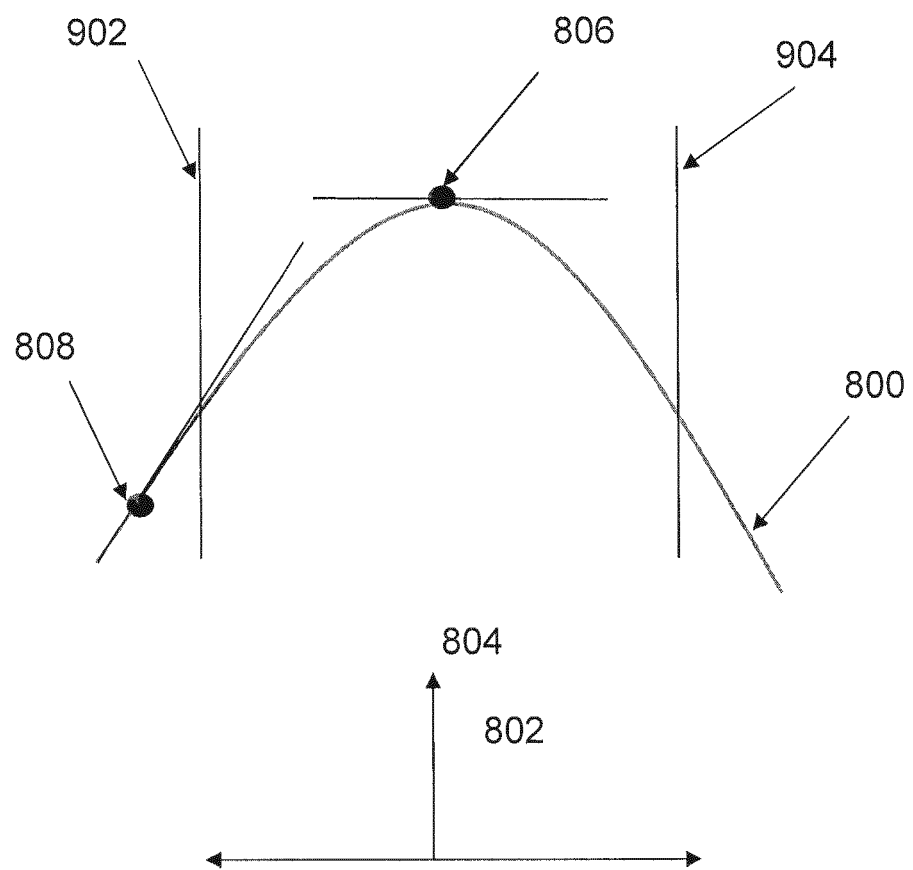
FIG. 9 schematically depicts a portion of an example Bossung curve for two process parameters.

Accordingly, in an embodiment, the first metrology target is designed to have a best measurement property for measurements at a first value of the process parameter and the second metrology target is designed to have its same best measurement property for measurements at a second different value of the process parameter. So, in terms of focus as the process parameter, a first metrology target is designed to have a best measurement property for measurements at a first focus value and the second metrology target is designed to have its same best measurement property for measurements at a second focus value. So, in an embodiment, a first metrology target is designed for measurements at a first focus value and the second metrology target is designed for measurements at a relatively large defocus value. In an embodiment, the first metrology target is designed for measurement at or near best focus or at another relatively large defocus (e.g., a relatively large negative defocus compared to a relatively large positive defocus for the first metrology target, or vice versa). In an embodiment, the second value of the process parameter is more than or equal to 30%, more than or equal to 40%, more than or equal to 50% or more than or equal to 60%, of a range of the process parameter from the first value of the process parameter. So, for example, referring to FIG. 9, the second value of the process parameter is at or to the left of line 902, which in terms of focus as the process parameter, may be, e.g., −0.5 of the depth of focus (the range of the process parameter, namely focus) from the best focus. As another example, referring to FIG. 9, the second value of the process parameter is at or to the right of line 904, which in terms of focus as the process parameter, may be, e.g., +0.5 of the depth of focus (the range of the process parameter, namely focus) from the best focus. Thus, in either case, the second value of the process parameter (e.g., focus) is more than or equal to 50% of a range of the process parameter (e.g., depth of focus) from the first value (e.g., best focus). In an embodiment, the second value of the process parameter is less than or equal to 70%, less than or equal to 80%, less than or equal to 85% or less than or equal to 90%, of the first value of the process parameter or the second value is more than or equal to 110%, more than or equal to 115%, more than or equal to 120% or more than or equal to 130%, of the first value.

For example, the measurement property of a metrology target may be zero-asymmetry (zero-crossing), which may be used for a diffraction periodic structure of a metrology target. At this point, for example, the plus and minus first diffraction orders are balanced in intensity at the desired process parameter value (e.g., at the desired focus value). At the zero-asymmetry (zero-crossing), the metrology target is robust (e.g., most robust) against, e.g., aberrations and/or dose variations. Further, the capture range of the metrology target is usually more or less symmetrical around the zero-asymmetry (zero-crossing). While the position of the zero-asymmetry (zero-crossing) may be designed such that it coincides as close as possible to the best focus, in an embodiment as described herein, the position of the zero-asymmetry (zero-crossing) may be designed such that it coincides at a defocus value as described above. In an embodiment, one or more additional or alternative measurement properties may be used by which the first and second metrology targets are differentiated.

As noted above, the first metrology target is designed for measuring a first range of values of a process parameter and the second metrology target is designed for measuring a second range of values of the same process parameter, the second range different than the first range. In an embodiment, the second range comprises or consists essentially of values more than or equal to 30%, more than or equal to 40%, more than or equal to 50% or more than or equal to 60%, of a range of the process parameter from a value in the first range. So, for example, referring to FIG. 9, the second range of values of the process parameter is at or to the left of line 902, which in terms of focus as the process parameter, may be, e.g., −0.5 of the depth of focus (the range of the process parameter, namely focus) from a value of focus in the first range, e.g., from the best focus. As another example, referring to FIG. 9, the second range of values of the process parameter is at or to the right of line 904, which in terms of focus as the process parameter, may be, e.g., +0.5 of the depth of focus (the range of the process parameter, namely focus) from a value of focus in the first range, e.g., from the best focus. Thus, in either case, the second range of the process parameter (e.g., focus) is more than or equal to 50% of a range of the process parameter (e.g., depth of focus) from a value in the first range (e.g., best focus). In an embodiment, the second range comprises or consists essentially of values less than or equal to 70%, less than or equal to 80%, less than or equal to 85% or less than or equal to 90%, of a value in the first range or the second range comprises values more than or equal to 110%, more than or equal to 115%, more than or equal to 120% or more than or equal to 130%, of a value in the first range. In an embodiment, the second range overlaps less than or equal to 30%, less than or equal to 40%, less than or equal to 50% or less than or equal to 60%, of the first range. In an embodiment, the first and second ranges do not overlap. In an embodiment, in terms of focus as the process parameter, the first range comprises best focus and the second range excludes best focus.

So, in an embodiment, there may be provided two or more metrology targets (e.g., metrology targets each comprising a diffraction periodic structure). Each of the metrology targets may be designed to measure respectively different ranges of a process parameter (e.g., focus). In an embodiment, each of the metrology targets may be designed to have its zero-asymmetry (zero-crossing) at different values of the process parameter. For example, if the process parameter is focus, a first metrology target may have its zero-asymmetry (zero-crossing) specified for best focus (i.e., the middle of the process window for focus), and a second metrology target may its zero-asymmetry (zero-crossing) specified at a defocus. In an embodiment, the second metrology target may have its zero-asymmetry (zero-crossing) specified for a negative defocus (i.e., the lower edge of the process window for focus) or have its zero-asymmetry (zero-crossing) specified for a positive defocus (i.e., the upper edge of the process window for focus). Thus, when constructing process window data, process parameter values determined from measuring the first metrology target may be used to construct that portion of the process window data at or near the middle of the process window. So, for example, if the process parameter is focus and the first metrology target is designed for at or near best focus, the focus values measured using the first metrology target may be used to determine process window data for focus values at or near best focus. And, process parameter values determined from measuring the second metrology target may be used to construct that portion of the process window data at or near the edge of the process window. So, for example, if the process parameter is focus and the second metrology target is designed for a relatively large defocus, the focus values measured using the second metrology target may be used to determine process window data for focus values at or near the relative large defocus (i.e., at the edge of the process window).

In an embodiment, at least a third metrology target may be designed for a third range of values of the same process parameter, the third range being different than the first and second ranges. In an embodiment, the first range is intermediate the second and third ranges. In an embodiment, the second and third ranges do not overlap. In an embodiment, if the process parameter is focus, the third metrology target may have its zero-asymmetry (zero-crossing) specified for a negative defocus (i.e., the lower edge of the process window for focus) or have its zero-asymmetry (zero-crossing) specified for a positive defocus (i.e., the upper edge of the process window for focus). In an embodiment, if the process parameter is focus, the second metrology target may have its zero-asymmetry (zero-crossing) specified for a negative defocus (i.e., the lower edge of the process window for focus) and the third metrology target may have its zero-asymmetry (zero-crossing) specified for a positive defocus (i.e., the upper edge of the process window for focus), or vice versa. And so, process parameter values determined from measuring the third metrology target may be used to construct that portion of the process window data at or near the edge of the process window. So, for example, if the process parameter is focus and the third metrology target is designed for a relatively large defocus, the focus values measured using the third metrology target may be used to determine process window data for focus values at or near the relative large defocus (i.e., at the edge of the process window). So, if, e.g., the second metrology target is designed for a negative defocus (i.e., the lower edge of the process window for focus) and the third metrology target is designed for a positive defocus (i.e., the upper edge of the process window for focus), the process parameter values determined from measuring the second metrology target may be used to construct that portion of the process window data at or near the lower edge of the process window and the process parameter values determined from measuring the third metrology target may be used to construct that portion of the process window data at or near the upper edge of the process window.

So, if the process parameter is focus and for relatively large defocus (in, e.g., focus exposure matrix or process window qualification exposure), the metrology target designed specifically for positive defocus is used to derive process window data at the upper edge of the process window. Further, the metrology target designed specifically for at or near best focus is used to derive process window data at the middle of the process window, and the metrology target designed specifically for negative defocus is used to derive process window data at the lower edge of the process window.

In an embodiment, a weighting of data obtained from the plurality of different metrology targets (e.g., two or more, or three or more, different metrology targets) is used. For example, when at the designed process parameter value for a particular metrology target, then, e.g. 100% of the data obtained using that particular metrology target may be used to derive the process window data. At points in between the designed process parameter values of respective metrology targets, the weighting ascribed to the data of a respective metrology target in deriving process window data may depend on, for example, the distance (e.g. estimated distance) of the process parameter data from the designed process parameter value for the particular metrology targets (e.g., the process parameter data from a first metrology target will be ascribed a higher weighting if the process parameter data is closer to the designed parameter value of the first metrology target than to a designed parameter value of a second metrology target) or the distance (e.g., estimated distance) of a measured parameter value of the metrology target from its design parameter value. In an example, where the process parameter is focus and a plurality of metrology targets are designed to have a zero-asymmetry (zero-crossing) specified for a certain focus, then, e.g., when at the zero-asymmetry (zero-crossing) for a first metrology target or for measured data from the first metrology target at its designed focus, the data from the first metrology target could be used 100% to derive the process window data and similarly, when at the zero-asymmetry (zero-crossing) for a second metrology target or for measured data from the second metrology target at its designed focus, the data from the second metrology target could be used 100% to derive the process window data. And, in between, data from the first and second metrology targets can be used with a weight ascribed to the data of each metrology target depending on their respective distance from zero-asymmetry (zero-crossing) or depending on their respective distance from their designed focuses. So, e.g., half-way between can be 50% weight applied to the first metrology target data and 50% weight applied to the second metrology target data or ¾ between can be 75% weight applied to the first metrology target data and 25% weight applied to the second metrology target data.

To enable appropriate use of the data from the metrology targets, it may be desirable to determine whether the measurement data is for the lower edge of the process window or for the upper edge of the process window. That is, it is desirable to determine "sign" information of the measured process parameter. So, if the process parameter is focus, it may be desirable to determine the "sign" of the defocus, i.e., whether it is negative defocus or positive defocus. If the process parameter is focus, the sign of the defocus may be determined by determining the side wall angle of one or more features of the metrology target. The range of side wall angles for relatively high positive defocus is different than the range of side wall angles for relatively high negative defocus.

Further, to enable better accuracy, it is desirable that a measurement of a metrology target parameter distinguishes between process parameters. That is, it is desirable to have separation between process parameters from the measurement of a metrology target. For example, the size (e.g., CD) of a feature may be impacted by, for example, focus and dose. Accordingly, the variation in CD of a feature from nominal may be due to both focus and dose. So, it is desirable to separate the impacts of dose and focus on a metrology target parameter (such as CD, side wall angle, diffraction order intensity asymmetry, etc.) such that a metrology target parameter value (e.g., a CD value, a value of side wall angle, an asymmetry in intensity of diffracted radiation, etc.) obtained from measurement of the metrology target can accurately represent focus (or accurately represent dose). To do so, in an embodiment, a metrology target parameter (e.g., CD, side wall angle, diffraction order intensity asymmetry, etc. of at least two metrology targets with respectively different feature pitches can be determined and from the determined metrology target parameter, separation between process parameters (e.g., between focus and dose) may be obtained because, e.g., one of the process parameters is more sensitive to pitch than another of the process parameters.

To enable better accuracy, the metrology target may be designed to be relatively insensitive to one or more other process parameters. So, for example, if the process parameter is focus, the metrology target may be designed to be relatively insensitive to dose and/or aberrations and/or one or more other process parameters so as to enable a metrology target parameter (e.g., CD) be more accurately representative of focus. The metrology target may be calibrated through use of the metrology target on one or more test substrates.

In an embodiment, it is desirable for the one or more metrology targets to have a sufficient capture (measurement) range. Accordingly, in an embodiment, the metrology target features (e.g., product features, a line/space CD target, etc.) and their appropriate physical characteristics (e.g., CD, pitch, etc.) are selected such that determined parameter values obtained when measuring the metrology target features has a Bossung top that is at or close to center of the applicable overlapping process window (e.g., the lower edge, middle or upper edge of the process window). In an embodiment, the metrology target features are selected such that determined parameter values obtained when measuring the metrology target features has sufficient Bossung curvature for sensitivity but also sufficient printing range (not too high curvature).

In an embodiment, attention may be needed for the calibration curves of the plurality of targets. For example, in an embodiment, the calibration curves should not have an offset with respect to one or more adjacent calibration curve and should have a smooth overlap (e.g., little or no discontinuity). For example, if at least three metrology targets are used with a first metrology target at or near best focus, a second metrology target at a relatively large negative defocus and a third metrology target at a relatively large positive defocus, then the curve of meaningful measurements (e.g., CD v. focus) obtainable for the first metrology target should overlap with the curve of meaningful measurements obtainable for the second metrology target and the curve of meaningful measurements obtainable for the first metrology target should overlap with the curve of meaningful measurements for the third metrology target so that a full range of focus can be obtained with meaningful (e.g., accurate) measurements. Thus, the metrology targets should be calibrated with respect to each other.

In an embodiment, a metrology target may comprise more than one periodic structure. In an embodiment, the plurality of periodic structures may be used to obtain multiple values of diffraction order asymmetry data, which can be used to calibrate the metrology target to improve sensitivity to optical aberrations.

Thus, in an embodiment, metrology targets (e.g., focus metrology targets) are specifically designed for the purpose of being able to measure accurately near a process window edge. In an embodiment, the result is more accuracy in process window data.

Figure 10:
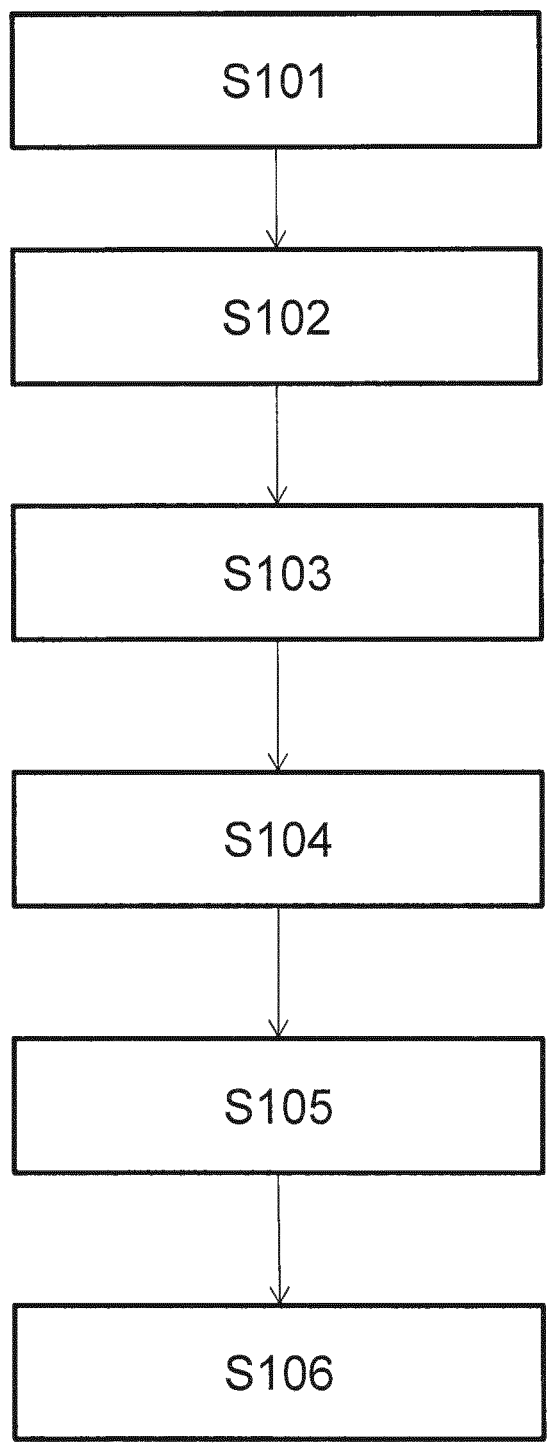
FIG. 10 depicts a flow diagram of a process to design one or more metrology targets and to determine values of a process parameter from the measured metrology targets.

Referring to FIG. 10, a flow diagram of a process to design one or more metrology targets and to determine values of a process parameter from the measured metrology targets. At S101, a first metrology target is designed. For example, the first metrology target may be designed for a first range of values of a process parameter (e.g., focus). In an embodiment, the first metrology target is designed to have a best measurement property for measurements at a first value of the process parameter.

At S102, one or more further metrology targets are designed. In an embodiment, a second metrology target is designed for a second range of values of the same process parameter, the second range different than the first range and the second metrology target having a different physical design than the first metrology target. In an embodiment, the one or more further metrology targets are designed to have their same best measurement property (as the first metrology target) for measurements at one or more different values of the process parameter. In an embodiment, at least three metrology targets are designed, wherein the second metrology target is designed for a second range of values of the same process parameter and the third metrology target is designed for a third range of values of the same process parameter, wherein the third range is different than the first and second ranges. In an embodiment, the first range is intermediate the second and third ranges.

At S103, the first and one or more further metrology targets are measured to derive values of the process parameter in the respective ranges.

At S104, process window data is derived from a value of the process parameter in the first range determined from the measuring of the first metrology target, and is derived from a value of the process parameter in the one or more further ranges determined from the measuring of the one or more further metrology targets.

At S105, a value of a process window parameter of the process window data is determined by measuring a target (e.g., a product feature, e.g., a clip such as a hotspot) formed at or near at one of the metrology targets. Further, the value of the process window parameter may be correlated with a value from one of the ranges.

At S106, having the process window data, at least part of a patterning process may be controlled (e.g., changed, monitored and kept within a limit, etc.) based on the process window data. Further, having the process window data, one or more parts of a patterning process (e.g., a patterning device pattern, one or more illumination parameters (e.g., illumination dose, illumination spatial or angular distribution, etc.) may be formed or configured (e.g., designed such as a patterning device pattern, illumination parameters, etc., or set such a lithographic apparatus parameter, such as focus, dose, etc.) based on the process window data. Thus, improved process window data obtained using a method as described herein can enable more accuracy in calibration of models (e.g., a resist model) used to control or design a patterning process (e.g., a model used in optimizing a patterning device pattern with associated illumination (sometimes referred to as source mask optimization (SMO)), a model for configuring a patterning device pattern to provide optical proximity correction (OPC), a model to enable a lithography manufacturing check through, e.g., comparison of full-chip simulated contours at nominal operating conditions and determination of substrate image variability and device yield loss due to patterning device pattern errors and focus-exposure process variation, etc.). In an embodiment, improved process window data obtained using a method as described herein can enable more accurate prediction of focus thresholds versus defects to enable process control of manufacturing of substrates using a patterning process.

Techniques for determining values of a process parameter from a metrology target are described in, for example, U.S. Patent Application Nos. US 2012/0013875 and US 2005/0185174, which are incorporated herein in their entirety by reference.

While discussion herein has focused on a patterning process, the techniques described herein may be used in another manufacturing process (e.g., etching, resist developing, etc. processes).

In an embodiment, the techniques have particular applicability in an optical metrology or inspection apparatus such as a scatterometer, an alignment sensor (which determines alignment between alignment marks), an encoder or interferometer (which enables position measurement), and/or a height or level sensor (which enables measuring of the position of a surface). So, while the embodiments disclosed herein use optical metrology as an application of the disclosed technique, the technique can be applied in other applications. The techniques need not be applied exclusively, and could be applied in combination with one or more other techniques.

The term "optimizing" and "optimization" as used herein mean adjusting an apparatus, e.g., a lithographic apparatus, such that device fabrication results and/or processes (e.g., of lithography) have one or more desirable characteristics, such as higher accuracy of projection of a design layout on a substrate, larger process window, etc.

The invention may further be described using the following clauses:

1. A method comprising:
measuring a first metrology target designed for a first range of values of a process parameter;
measuring a second metrology target designed for a second range of values of the same process parameter, the second range different than the first range and the second metrology target having a different physical design than the first metrology target; and
deriving process window data from a value of the process parameter in the first range determined from the measuring of the first metrology target, and from a value of the process parameter in the second range determined from the measuring of the second metrology target.
2. The method of clause 1, wherein the first metrology target is designed to have a best measurement property for measurements at a first value of the process parameter and the second metrology target is designed to have its same best measurement property for measurements at a second different value of the process parameter.
3. The method of clause 2, wherein the second value is more than or equal to 30%, more than or equal to 40%, more than or equal to 50% or more than or equal to 60%, of a range of the process parameter from the first value of the process parameter.
4. The method of any of clauses 1 to 3, wherein the second range consists essentially of values more than or equal to 30%, more than or equal to 40%, more than or equal to 50% or more than or equal to 60%, of a range of the process parameter from a value in the first range.
5. The method of any of clauses 1 to 4, wherein the second range overlaps less than or equal to 30%, less than or equal to 40%, less than or equal to 50% or less than or equal to 60%, of the first range.
6. The method of any of clauses 1 to 5, wherein the first and second ranges do not overlap.
7. The method of any of clauses 1 to 6, wherein the deriving process window data comprising applying a different weighting between the value of the process parameter in the first range and the value of the process parameter in the second range.
8. The method of clause 7, wherein the weighting depends on a distance of the value of the process parameter from a respective designed process parameter value for the first and second metrology targets or depends on a distance of the value of a measured parameter from a respective designed measured parameter value for the first and second metrology targets.
9. The method of any of clauses 1 to 8, wherein the process parameter comprises focus.
10. The method of clause 9, wherein the first range comprises best focus and the second range excludes best focus.
11. The method of clause 9 or clause 10, wherein the second range comprises values more than or equal to 30%, more than or equal to 40%, more than or equal to 50% or more than or equal to 60%, of a depth of focus from best focus.
12. The method of any of clauses 1 to 11, further comprising controlling at least part of a patterning process based on the process window data.
13. The method of any of clauses 1 to 12, further comprising measuring a third metrology target designed for a third range of values of the same process parameter, the third range different than the first and second ranges, and deriving the process window data from a value of the process parameter in the third range determined from the measuring of the third metrology target.
14. The method of clause 13, wherein the first range is intermediate the second and third ranges.
15. The method of clause 13 or clause 14, wherein the second and third ranges do not overlap.
16. The method of any of clauses 1 to 15, further comprising determining a value of a process window parameter of the process window data by measuring a target formed at or near at one of the metrology targets.
17. The method of clause 16, further comprising correlating the value of the process window parameter with a value from one of the ranges.
18. The method of any of clauses 1 to 17, wherein the first and second metrology targets each comprise a diffraction periodic structure.
19. A method comprising:
measuring a first metrology target designed to have a best measurement property for measurements at a first value of a process parameter;
measuring a second metrology target designed to have its same best measurement property for measurements at a second different value of the process parameter; and deriving process window data from measurement of the process parameter using the first and second metrology targets.

20. A method comprising
obtaining process window data derived from values of a process parameter in a first range determined from measuring of a first metrology target, and from values of the same process parameter in a second range, different from the first range, determined from measuring of a second metrology target, wherein the second metrology target has a different physical design than the first metrology target; and
forming and/or controlling at least part of a patterning process based on the process window data.

21. A method of manufacturing devices wherein a device pattern is applied to a series of substrates using a patterning process, the method including obtaining process window data using the method of any of clauses 1 to 20, and controlling at least part of the patterning process for later substrates in accordance with the result of the method.

22. A non-transitory computer program product comprising machine-readable instructions for causing a processor to cause performance of the method of any of clauses 1 to 21.

23. A system comprising:
an inspection apparatus configured to provide a beam on a metrology target on a substrate and to detect radiation redirected by the metrology target to determine a parameter of a patterning process; and
the non-transitory computer program product of clause 22.

24. The system of clause 23, further comprising a lithographic apparatus, the lithographic apparatus comprising a support structure configured to hold a patterning device to modulate a radiation beam and a projection optical system arranged to project the modulated onto a radiation-sensitive substrate.

25. A first metrology target and second metrology target as specified in any of clauses 1 to 20 for practicing the method of that clause.

26. A patterning device structure configured to at least in part form the first and second metrology targets of clause 25.

27. A patterning system fiducial comprising the first and second metrology targets of clause 25.

28. A non-transitory computer program product comprising machine-readable instructions or data defining the first and second metrology targets of clause 25.

29. A substrate comprising the first and second metrology target of clause 25 or the patterning system fiducial of clause 27.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs. Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or more processed layers.

Although specific reference may have been made above to the use of embodiments of the invention in the context of optical lithography, it will be appreciated that the invention may be used in other applications, for example imprint lithography, and where the context allows, is not limited to optical lithography. The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method comprising:
measuring a first metrology target designed for a first range of values of a process parameter;
measuring a second metrology target designed for a second range of values of the same process parameter, the second range different than the first range and the second metrology target having a different physical design than the first metrology target; and
deriving process window data from a value of the process parameter in the first range determined from the measuring of the first metrology target, and from a value of the process parameter in the second range determined from the measuring of the second metrology target.

2. The method of claim 1, wherein the first metrology target is designed to have a certain desired optimum value of a measurement property for measurements at a first value of the process parameter and the second metrology target is designed to have its own desired optimum value of the same measurement property for measurements at a second different value of the process parameter.

3. The method of claim 1, wherein the second range consists essentially of values more than or equal to 30%, more than or equal to 40%, more than or equal to 50% or more than or equal to 60%, of the values of a range of the process parameter from a value in the first range.

4. The method of claim 1, wherein the first and second ranges do not overlap.

5. The method of claim 1, wherein the deriving process window data comprises applying a different weighting between the value of the process parameter in the first range and the value of the process parameter in the second range.

6. The method of claim 5, wherein the weighting depends on a distance of the value of the process parameter from a respective designed process parameter value for the first and second metrology targets or depends on a distance of the value of a measured parameter from a respective designed measured parameter value for the first and second metrology targets.

7. The method of claim 1, wherein the process parameter comprises focus.

8. The method of claim 7, wherein the first range comprises best focus to expose a pattern using a lithographic process and the second range excludes best focus to expose the pattern using the lithographic process.

9. The method of claim 7, wherein the second range comprises values more than or equal to 30% of a depth of focus from best focus.

10. The method of claim 1, further comprising controlling, setting or changing at least part of a patterning process based on the process window data.

11. The method of claim 1, further comprising measuring a third metrology target designed for a third range of values of the same process parameter, the third range different than the first and second ranges, and deriving the process window data from a value of the process parameter in the third range determined from the measuring of the third metrology target.

12. The method of claim 11, wherein the first range is intermediate the second and third ranges.

13. The method of claim 1, further comprising determining a value of a process window parameter of the process window data by measuring a target formed at or near at the first or second metrology target.

14. A method comprising:
 measuring a first metrology target designed to have a certain desired optimum value of a measurement property for measurements at a first value of a process parameter;
 measuring a second metrology target designed to have its own desired optimum value of the same measurement property for measurements at a second different value of the process parameter; and
 deriving process window data from measurement of the process parameter using the first and second metrology targets.

15. A non-transitory computer program product comprising machine-readable instructions configured to cause a processor system to at least:
 obtain a measurement of a first metrology target designed for a first range of values of a process parameter;
 obtain a measurement of a second metrology target designed for a second range of values of the same process parameter, the second range different than the first range and the second metrology target having a different physical design than the first metrology target; and
 derive process window data from a value of the process parameter in the first range determined from the measuring of the first metrology target, and from a value of the process parameter in the second range determined from the measuring of the second metrology target.

16. The computer program product of claim 15, wherein the first metrology target is designed to have a certain desired optimum value of a measurement property for measurements at a first value of the process parameter and the second metrology target is designed to have its own desired optimum value of the same measurement property for measurements at a second different value of the process parameter.

17. The computer program product of claim 15, wherein the second range consists essentially of values more than or equal to 30%, more than or equal to 40%, more than or equal to 50% or more than or equal to 60%, of the values of a range of the process parameter from a value in the first range.

18. The computer program product of claim 15, wherein the first and second ranges do not overlap.

19. The computer program product of claim 15, wherein the instructions configured to cause the derivation of the process window data are further configured to apply a different weighting between the value of the process parameter in the first range and the value of the process parameter in the second range.

20. A non-transitory computer program product comprising machine-readable instructions configured to cause a processor system to at least:
 obtain a measurement of a first metrology target designed to have a certain desired optimum value of a measurement property for measurements at a first value of a process parameter;
 obtain a measurement of a second metrology target designed to have its own desired optimum value of the same measurement property for measurements at a second different value of the process parameter; and
 derive process window data from measurement of the process parameter using the first and second metrology targets.

21. The computer program product of claim 20, wherein instructions are further configured to control, set or change at least part of a patterning process based on the process window data.

22. The method of claim 14, further comprising controlling, setting or changing at least part of a patterning process based on the process window data.

23. The computer program product of claim 15, wherein instructions are further configured to control, set or change at least part of a patterning process based on the process window data.

* * * * *